(12) United States Patent
Lee

(10) Patent No.: US 6,316,325 B1
(45) Date of Patent: Nov. 13, 2001

(54) METHOD FOR FABRICATING A THIN FILM RESISTOR

(75) Inventor: Jia-Sheng Lee, Hsinchu (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 09/192,204

(22) Filed: Nov. 13, 1998

(51) Int. Cl.⁷ .................................................. H01L 21/62
(52) U.S. Cl. ................................................................ 438/384
(58) Field of Search .................................. 438/381, 384, 438/382, FOR 220; 148/DIG. 136

(56) References Cited

U.S. PATENT DOCUMENTS 4,822,749 * 4/1989 Flanner et al. .
5,414,404 * 5/1995 Jeong et al. .
5,462,894 * 10/1995 Spinner et al. .

OTHER PUBLICATIONS

Narizuka, et al., Properties if High Resistivity Cr–Si–O TF resistors, (IEEE), pp. 609–613, 1988.*

* cited by examiner

*Primary Examiner*—George Fourson
(74) *Attorney, Agent, or Firm*—Charles C. H . Wu; Charles C. H. Wu & Associates

(57) ABSTRACT

A method for fabricating a thin film resistor is provided. The method contains forming a patterned conductive layer on a dielectric layer, which is formed over a substrate having a semiconductor device. The patterned conductive layer has a first opening to expose a portion of the substrate. An insulating layer is formed over the substrate and is planarized, in which the first opening is filled by the insulating layer. Patterning the insulating layer forms a second opening that exposes the first opening and a portion of the patterned conductive layer at a place, where a thin film resistor is desired to be formed. A thin film resistor conformal to the second opening is formed over the dielectric layer to at least cover the opening.

20 Claims, 6 Drawing Sheets

METHOD FOR FABRICATING A THIN FILM RESISTOR

BACKGROUND OF THE INVENTION

1. Field of the Invention

This invention relates to semiconductor fabrication, and more particularly to a method for fabricating a thin film resistor over a semiconductor device.

2. Description of Related Art

In semiconductor fabrication for an integrated circuit (IC) device, the $N^+$, $P^+$, well and poly usually also serve as resistor layers but they have relatively lower resistance. Resistance, R, of a material typically is expressed as:

$$R = \rho \, L/A,$$

where $\rho$ is the resistivity of the material with a unit $\Omega$-cm, L is the length of the material, and A is the cross-sectional area.

In order to increase resistance R, one can either reduce the cross-sectional area A or increase the length L. Since the resistor layer has its minimum cross-sectional area A in IC fabrication, one choice is increasing the length L so as to achieve the desired higher resistance R. However, as the device dimension of IC is reduced, the length L may consume too much of the available fabrication area. It is necessary to use another material with higher resistivity to take the places of $N^+$, $P^+$, well and poly. One of the materials with higher resistivity is SiCr, which is often used to form a thin film resistor.

FIGS. 1A–1K are cross-sectional views of a portion of a substrate, schematically illustrating conventional fabrication processes of a thin film resistor.

In FIG. 1A, a dielectric substrate 10 is provided. Below the dielectric substrate 10, several semiconductor devices formed on a semiconductor substrate may have been formed but not shown. The dielectric substrate 10 is, for example, an interconnect dielectric layer including borophosphosilicate glass (BPSG), phosphosilicate glass (PSG), $Si_3N_4$, $SiO_xN_y$, or $SiO_2$. The dielectric substrate 10 is formed by chemical vapor deposition (CVD).

In FIG. 1B, a thin film resistor 12 including SiCr is formed by sputtering deposition at about 300° C. on the dielectric substrate 10. In FIG. 1C, a passivation layer 14 is formed on the thin film resistor 12. The passivation layer 14 including aluminum or a mix of Al/Si/Cu is used to protect the thin film resistor 12 from damages due to subsequent fabrication process. In FIG. 1D, a photoresist layer 16 with a desired pattern is formed on the passivation layer 14. In FIG. 1E, using the photoresist layer 16 as a mask, the passivation layer 14 is etched by a plasma etching process to expose a portion of the thin film resistor 12 beside the photoresist layer 16. The passivation layer 14 becomes a passivation layer 14a. The photoresist layer 16 is removed. In FIG. 1F, using the passivation layer 14a as a mask, the exposed portion of the thin film resistor 12 is removed by plasma etching. The thin film resistor 12 becomes a thin film resistor 12a.

In FIG. 1G, a metal layer 18 is formed over the dielectric substrate 10, in which the passivation layer 14a and the thin film resistor 12a are covered.

In FIG. 1H, a patterned photoresist layer 20 is formed on the metal layer 18, which has an exposed portion above the passivation layer 14a.

In FIG. 1I, using the photoresist layer 20 as a mask, a plasma etching process is performed to remove the exposed portion of the metal layer 18 so that the passivation layer 14a portion of the dielectric substrate 10 are exposed. The metal layer 18 becomes a metal layer 18a. A remaining portion of the metal layer 18 forms a metal spacer 22 on each sidewall of the passivation layer 14a and the thin film resistor 12a. The photoresist layer 20 is removed.

In FIG. 1J, a photoresist layer 24 is formed over the dielectric layer 10 is fully cover the conductive layer 18a but leave the metal spacer 22, the passivation layer 14a, and a portion of the dielectric substrate 10 at each side of the passivation layer 14a to be exposed.

In FIG. 1J and FIG. 1K, using the photoresist layer 24 as a mask, the passivation layer 14a and the metal spacer 22 are removed by wet etching so that the thin film resistor 12a is exposed. The photoresist layer 24 is removed so that there are the thin film resistor layer 12a and the metal layer 18a remaining on the dielectric substrate 10.

As an IC device is formed at a deep sub-micron level with a greatly reduced dimension, the wet etching to remove the passivation layer 14a and the metal spacer 22 of FIG. 1J in no longer suitable. Moreover, the thin film resistor 12a will be covered by a conductive layer subsequently formed over the dielectric substrate 10. It becomes difficult to change a bad thin film resistor 12a with a poor performance or to adjust the resistance of the thin film resistor 12a.

Furthermore, the conventional method for fabricating the thin film resistor 12a includes several complicate processes. The conventional method needs several plasma etching processes, which needs several times of loading/unloading on the etching machine, and several types of etchant are necessarily used. The included processes are generally not compatible with the current facility of a wafer fab so that the fabrication cost is greatly increased. In addition, the plasma remains resulting from several plasma etching process may cause a plasma damage on the IC device. The electrical properties of the IC device is degraded, resulting in a poor performance of operation.

SUMMARY OF THE INVENTION

It is therefore an objective of the present invention to provide a method for fabricating a thin film resistor with a more simple fabrication process.

It is another objective of the present invention to provide a method for fabricating a thin film resistor. The method of the invention is compatible with current facility of a wafer fab so that fabrication cost can be reduced.

It is still another objective of the present invention to provide a method for fabricating a thin film resistor. The method of the invention includes fewer times of plasma etching processes so that a plasma damage is effectively avoided.

It is still yet another objective of the present invention to provide a method for fabricating a thin film resistor. The thin film resistor can be easily changed if it is necessary. The resistance of the thin film resistor can also be easily amended by, for example, a laser.

It is still yet another objective of the present invention to provide a method for fabricating a thin film resistor. The method includes no wet etching so that the thin film resistor is suitable for a fabrication level of deep sub-micron.

In accordance with the foregoing and other objectives of the present invention, a method for fabricating a thin film resistor is provided. The method includes forming a patterned conductive layer on a dielectric layer, which is formed over a substrate having a semiconductor device. The patterned conductive layer includes a first opening to expose a portion of the substrate. An insulating layer is formed over the substrate and is planarized, in which the first opening is filled by the insulating layer. Patterning the insulating layer forms a second opening that exposes the first opening and a portion of the patterned conductive layer at a plate, where a thin film resistor is desired to be formed. A thin film resistor conformal to the second opening is formed over the dielectric layer to at least cover the opening.

In the foregoing, the thin film resistor is formed by forming a conformal thin film resisting layer over the substrate, and removing a portion of the thin film resisting layer other than the second opening by, for example, plasma etching. The thin film resistor of the invention is formed on the conductive layer so that the thin film resistor can be easily formed. An amendment, if it is necessary, can be easily performed. The method includes no wet etching so that the method is very suitable for a fabrication with greatly reduced dimension.

BRIEF DESCRIPTION OF DRAWINGS

The invention can be more fully understood by reading the following detailed description of the preferred embodiment, with reference made to the accompanying drawings as follows.

DETAILED DESCRIPTION OF PREFERRED EMBODIMENT

Figure 2A:
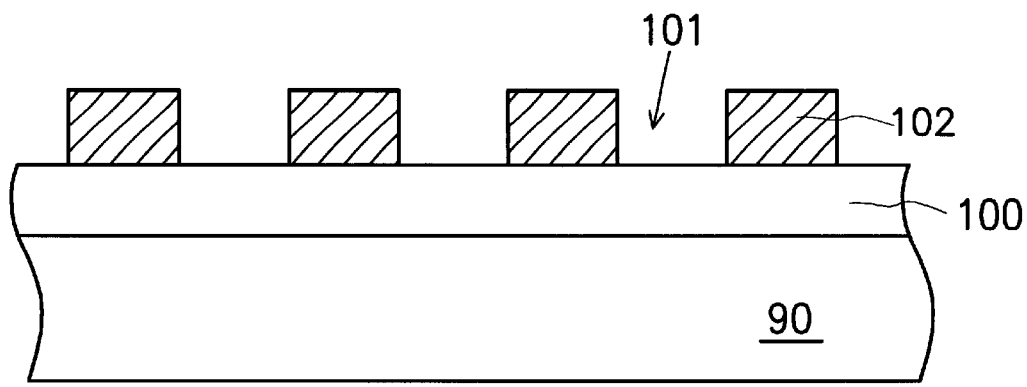
FIGS. 2A–2E are cross-sectional views of a portion of a substrate, schematically illustrating fabrication processes of a thin film resistor, according to a preferred embodiment of the invention.

FIGS. 2A–2E are cross-sectional views of a portion of a substrate, schematically illustrating fabrication processes of a thin film resistor, according to a preferred embodiment of the invention. In FIG. 2A, a dielectric layer 100 is formed over a substrate 90, which may include a semiconductor device (not shown), such as a photo-diode. The dielectric layer 100 includes, for example, BPSG, PGS, $Si_3N_4$, $SiO_xN_y$, or silicon oxide and is formed, for example, by CVD. The BPSG is preferably used. A planarization process, such as a thermal flow, is also performed to planarize the dielectric layer 100. A conductive layer 102, such as a metal layer, is formed on the dielectric layer 100. The conductive layer 102 is patterned so that one or several openings 101 are formed in the conductive layer 102. The openings 101 expose the dielectric layer 100. The conductive layer 102 serves as a portion of an interconnect of a whole semiconductor device.

Figure 2B:
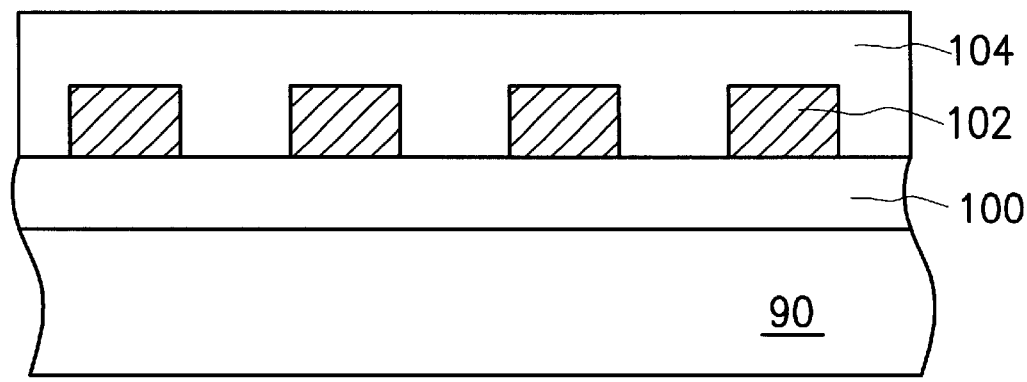

In FIG. 2B, an insulating layer 104 is formed over the dielectric layer 100 to cover the dielectric layer 100 and the conductive layer 102 so that the openings 101 are also covered. The formation of the insulating layer 104 includes, for example, a CVD process. The insulating layer 104 preferably includes silicon oxide or BPSG, and is properly planarized.

Figure 2C:
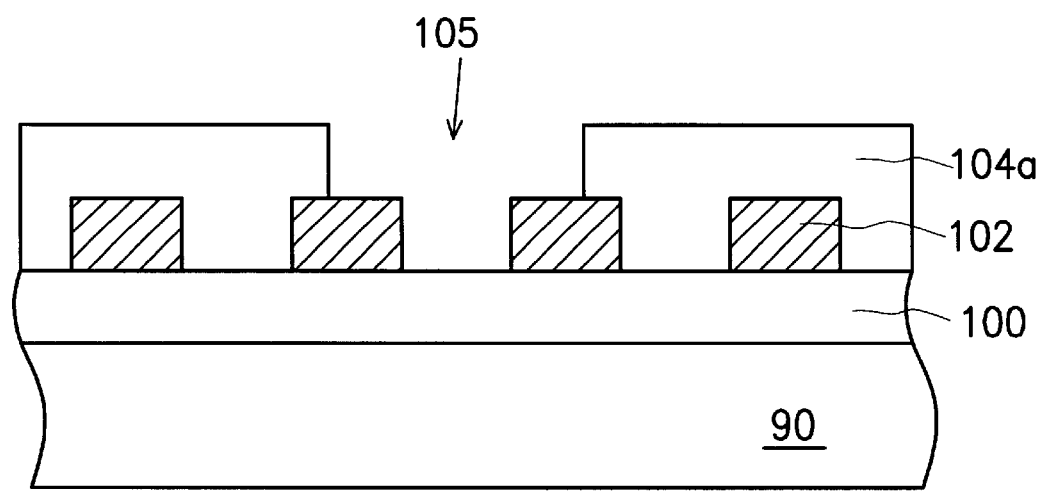

In FIG. 2B and FIG. 2C, the insulating layer 104 is patterned by, for example, photolithography and etching to form an opening 105 that exposes, for example, one of the openings 101, shown in FIG. 2A, so as to expose the dielectric layer 100. The conductive layer becomes a conductive layer 104a. A portion of the conductive layer 102 around the exposed opening 101 is also exposed by the opening 105. The purpose of the opening 105 is to preserve a region for forming a thin film resistor on it.

Figure 2D:
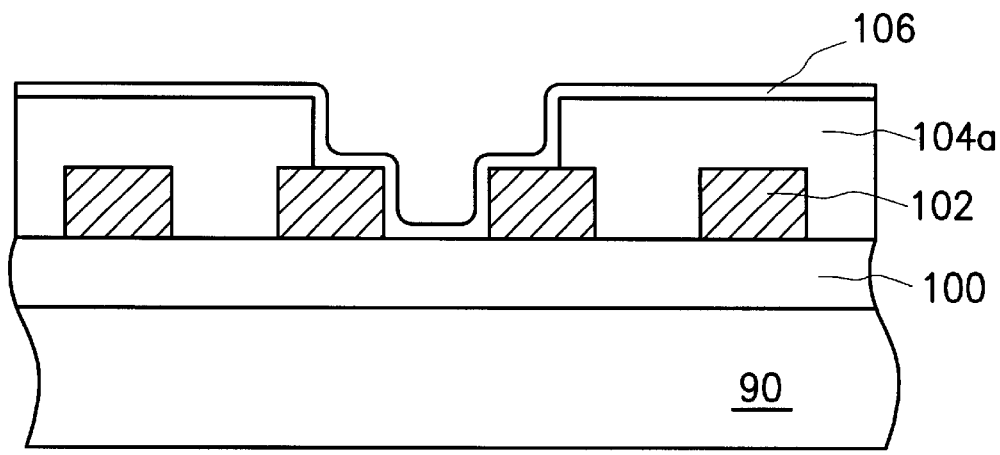

In FIG. 2C and FIG. 2D, a thin film resisting layer 106, conformal to a top surface of the substrate 90, is formed over the substrate 90 so that the inner surface of the opening 105 is also covered by thin film resisting layer 106. The formation of the thin film resisting layer 106 includes performing a sputtering deposition process, using radio-frequency (RF) power source at a temperature of about 300° C. The thin film resisting layer 106 preferably includes SiCr, which has greater resistivity than that of the other usual materials of $N^+$, $P^+$, well or poly, and has a thickness of about a few hundred Å.

Figure 2E:
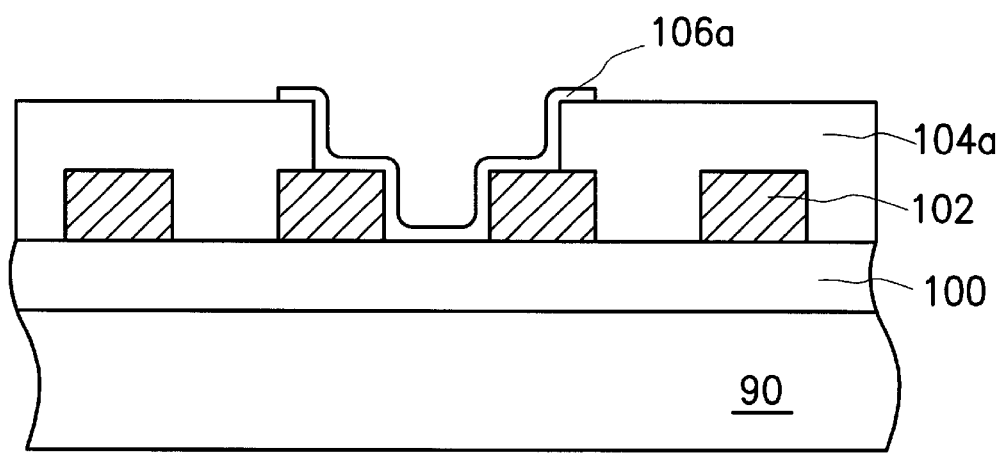

In FIG. 2D and FIG. 2E, patterning the thin film resisting layer 106 forms a thin film resistor 106a over the opening 105, shown in FIG. 2C. The thin film resistor 106a is conformal to the opening 105. The patterning process includes for example photolithography and etching. The etching process includes, for example, a plasma etching.

The thin film resistor 106a of the invention is formed above the conductive layer 102, using fewer times of plasma etching processes. The wet etching process is totally avoided in the invention. These gives several advantages as follows:

1. The fabrication method of the invention is effectively simplified so that fabrication cost and fabrication time are effectively reduced. Since fewer times of plasma etching processes are included, the plasma damage of the device is effectively avoided. Moreover, the fabrication processes used in the invention are compatible with the current facility of manufacturers. It is easy to form the thin film resistor without special treatments.

Figure 1A:
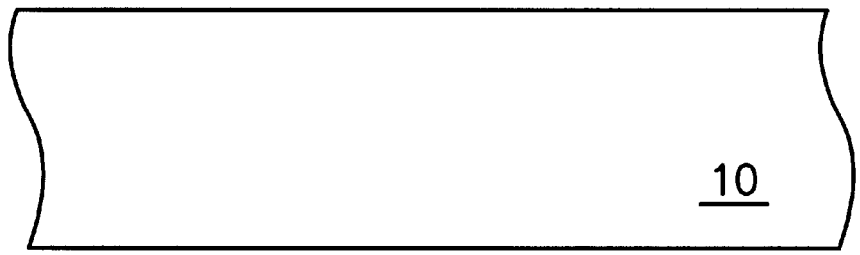
FIGS. 1A–1K are cross-sectional views of a portion of a substrate, schematically illustrating conventional fabrication processes of a thin film resistor.
Figure 1B:
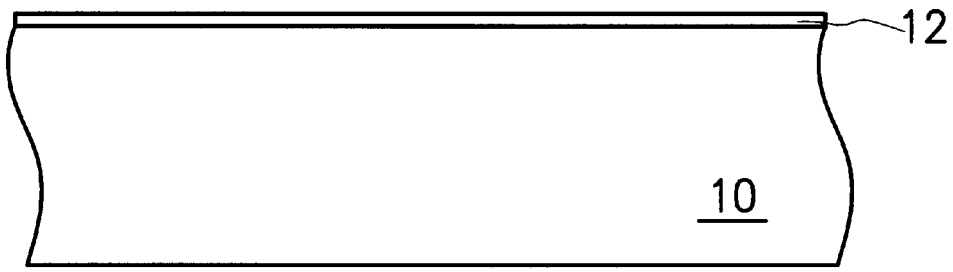
Figure 1C:
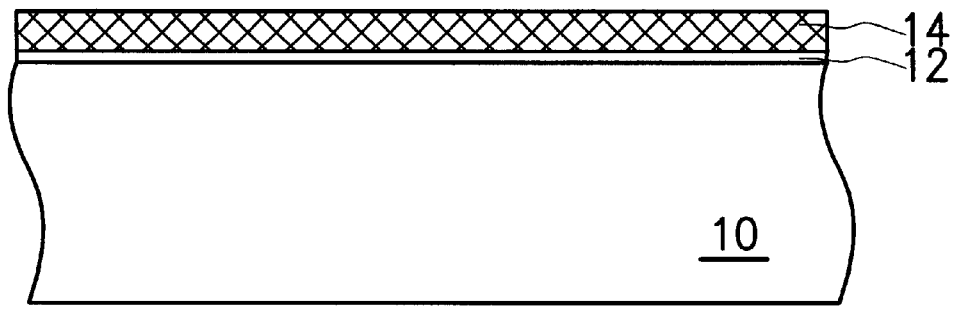
Figure 1D:
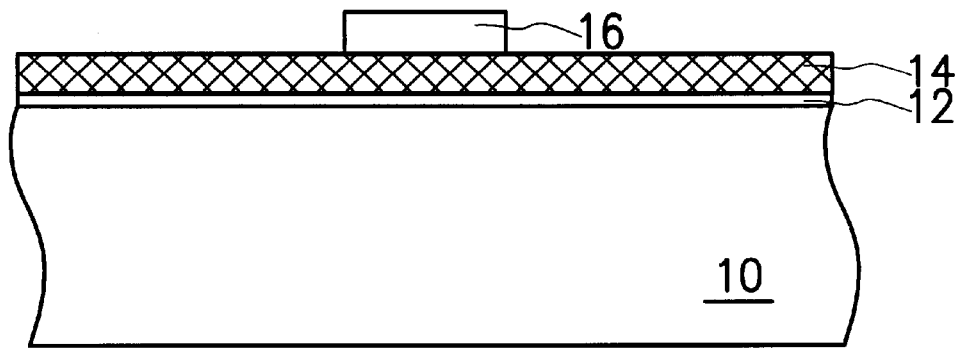
Figure 1E:
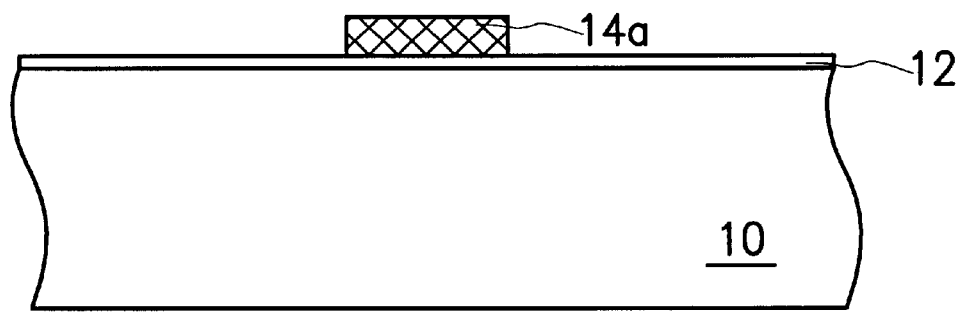
Figure 1F:
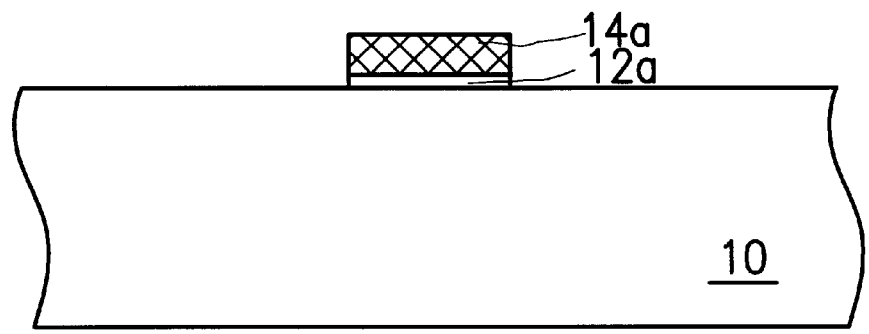
Figure 1G:
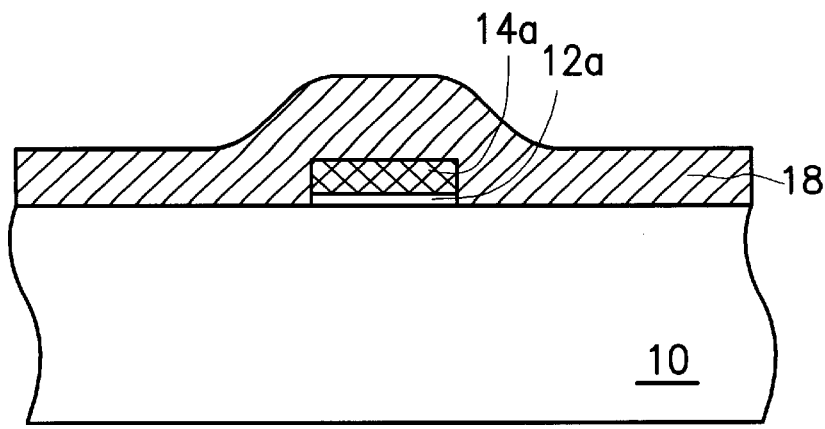
Figure 1H:
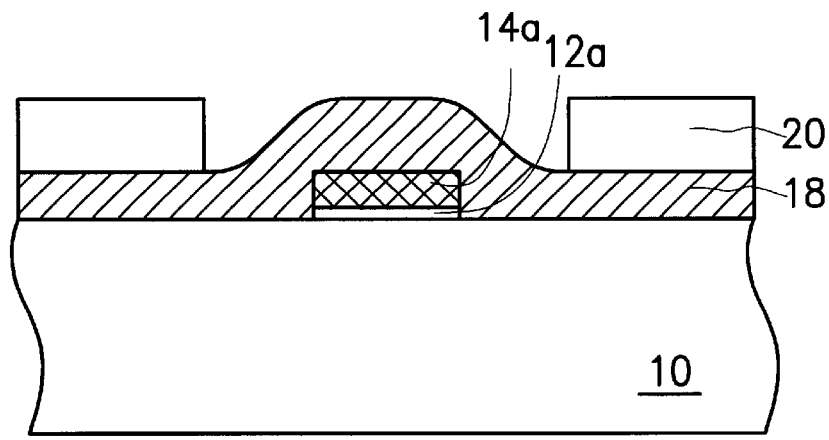
Figure 1I:
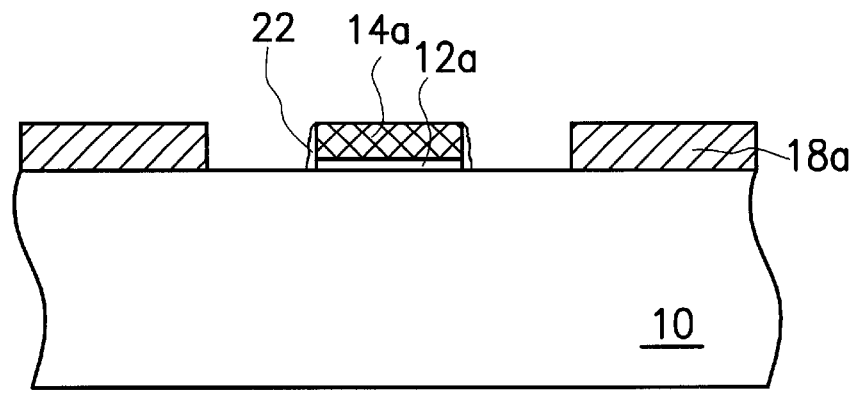
Figure 1J:
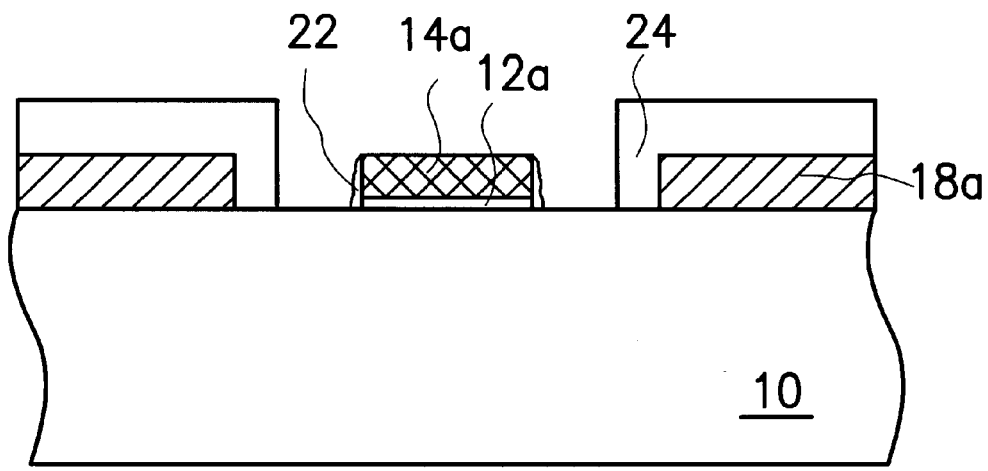
Figure 1K:
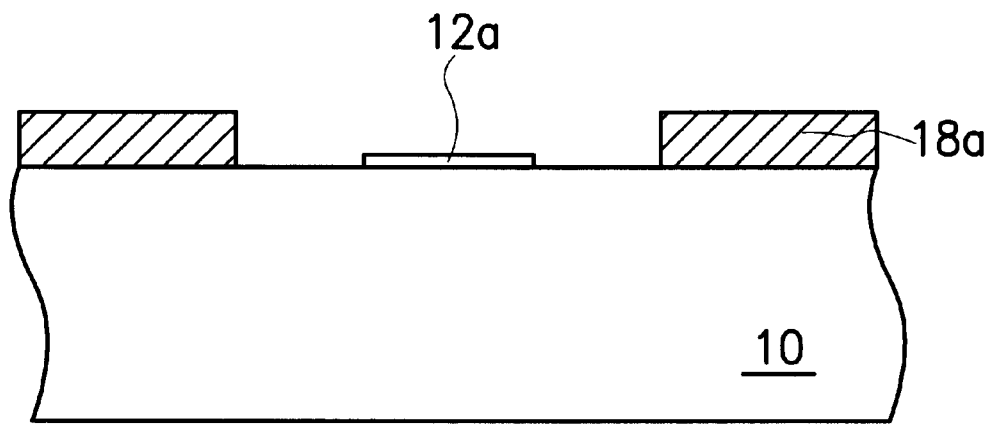

1. The thin film resistor is formed on the conductive layer so that the thin film resistor is easier to be amended by, for example, laser for adjusting its resistance quantity if it is necessary. A damaged thin film resistor can even be easily removed if it occurs. The conventional thin film resistor 12a of FIG. 1K is covered by a conductive layer formed subsequently so that any amendment is always difficult.

3. The invention includes no wet etching process so that the method is very suitable for a fabrication having greatly reduced dimension, such as a level of deep submicron or less.

The invention has been described using an exemplary preferred embodiment. However, it is to be understood that the scope of the invention is not limited to the disclosed embodiment. On the contrary, it is intended to cover various modifications and similar arrangements. The scope of the claims, therefore, should be accorded the broadest interpretation so as to encompass all such modifications and similar arrangements.

What is claimed is:

1. A method for fabricating a thin film resistor, the method comprising:

providing a substrate;

forming a patterned conductive layer on the substrate, wherein the patterned conductive layer comprises a first opening that exposes the substrate;

forming an insulating layer over the substrate so that the first opening is also filled;

patterning the insulating layer to form a second opening to expose the first opening and a portion of the patterned conductive layer so that the entire substrate between patterned conductive layer within the first opening is exposed; and forming a thin film resistor over the substrate to entirely cover the second opening patterning the thin film resistor to expose a portion of the insulating layer wherein the thin film resistor entirely covers the opening and a portion of the patterned conductive layer.

2. The method of claim 1, wherein the patterned conductive layer comprises a metallic material.

3. The method of claim 1, wherein the step of forming the patterned conductive layer further comprises:

forming a preliminary conductive layer over the substrate; and patterning the preliminary conductive layer to form the patterned conductive layer.

4. The method of claim 1, wherein the step of forming the thin film resistor further comprises:

forming a conformal thin film resisting layer over the substrate; and removing a portion of the conformal thin film resisting layer other than in the second opening to form the thin film resistor to at least cover the second opening.

5. The method of claim 4, wherein the conformal thin film resisting layer comprises SiCr.

6. The method of claim 4, wherein the step of forming the conformal thin film resisting layer comprises a sputtering deposition process.

7. The method of claim 6, wherein the sputtering deposition process is performed at a temperature of about 300° C. with a radio-frequency (RF) power source.

8. The method of claim 4, wherein the step of removing the portion of the conformal thin film resisting layer comprises a plasma etching process.

9. The method of claim 1, wherein the substrate comprises a dielectric layer on top.

10. The method of claim 9, wherein the dielectric layer comprises borophosphosilicate glass (BPSG).

11. The method of claim 9, wherein the dielectric layer comprises phosphosilicate glass (PSG).

12. The method of claim 9, wherein the dielectric layer comprises silicon oxide.

13. The method of claim 9, wherein the dielectric layer comprises silicon nitride.

14. The method of claim 1, wherein the insulating layer comprises silicon oxide.

15. The method of claim 1, wherein the insulating layer comprises BPSG.

16. The method of claim 1, wherein the step of forming the insulating layer comprises chemical vapor deposition (CVD).

17. The method of claim 1, wherein the step of forming the insulating layer comprises a planarization process.

18. A method for fabricating a thin film resistor, the method comprising:

providing a substrate;

forming a patterned conductive layer on the substrate, wherein a portion of the substrate is still exposed;

forming an insulating layer over the substrate with an opening that exposes the entire substrate between patterned conductive layer and a portion of the patterned conductive layer; and forming a thin film resistor over the substrate to entirely cover the opening patterning the thin film resistor to expose a portion of the insulating layer wherein the thin film resistor entirely covers the opening and a portion of the patterned conductive layer.

19. The method of claim 18, wherein the substrate comprises a dielectric layer on top.

20. The method of claim 18, wherein the step of forming the thin film resistor further comprises:

forming a conformal thin film resisting layer over the substrate; and removing a portion of the conformal thin film resisting layer other than in the opening to form the thin film resistor to at least cover the opening.

* * * * *